(12) United States Patent
Keaney et al.

(10) Patent No.: US 7,046,746 B1
(45) Date of Patent: May 16, 2006

(54) ADAPTIVE VITERBI DECODER FOR A WIRELESS DATA NETWORK RECEIVER

(75) Inventors: Richard A. Keaney, Manly (AU); Thomas McDermott, Thornleigh (AU); Philip J. Ryan, Stanmore (AU)

(73) Assignee: Cisco Systems Wireless Networking (Australia) Pty Limited, North Sydney (AU)

( * ) Notice: Subject to any disclaimer, the term of this patent is extended or adjusted under 35 U.S.C. 154(b) by 842 days.

(21) Appl. No.: 10/095,758

(22) Filed: Mar. 11, 2002

Related U.S. Application Data

(60) Provisional application No. 60/277,370, filed on Mar. 19, 2001, provisional application No. 60/283,609, filed on Apr. 13, 2001, provisional application No. 60/322,415, filed on Sep. 14, 2001.

(51) Int. Cl.
*H03D 1/00* (2006.01)
*H03M 13/03* (2006.01)

(52) U.S. Cl. .................. 375/341; 375/265; 714/795
(58) Field of Classification Search ............... 375/341, 375/265; 714/795
See application file for complete search history.

(56) References Cited

U.S. PATENT DOCUMENTS

| | | | |
|---|---|---|---|
| 5,042,036 A | 8/1991 | Fettweis | 371/43 |
| 5,220,570 A | 6/1993 | Lou et al. | 371/43 |
| 5,787,127 A * | 7/1998 | Ono et al. | 375/341 |
| 5,796,757 A * | 8/1998 | Czaja | 714/789 |
| 6,130,894 A * | 10/2000 | Ojard et al. | 370/421 |

OTHER PUBLICATIONS

C. Jego, E. Casseau, E. Martin, "Toward behavioural level IPs : high level synthesis of the Viterbi algorithm", International workshop on IP based synthesis and system design, IP 98, Grenoble, France, Dec. 1998, pp. 121-126.

S. Ranpara, "On a Viterbi decoder design for lower power dissipation", *Thesis*, Virginia Polytechnic Institute, Blacksburg, Virginia, Apr. 1999.

CAST, Inc. Viterbi Decoder Product Specification Data Sheet, Jan. 1999.

Xilinx, Inc. LogiCare Viterbi Decoder V1.0 Product Specification Data Sheet, Jun. 2001.

S. Gardner, T. Hardin "Accelerating Viterbi Decoder Simulations", Communication Design, Jan. 1999, http://www.commsdesign.com/main/1999/9901/9901feat2.htm.

R. Burger, G. Cesana, M. Paolini, M. Turolla, S. Vercelli, "A Fully Synthesizable Parameterized Viterbi Decoder". In Proceedings of the IEEE Custom Integrated Circuits Conference, May 1999.

\* cited by examiner

*Primary Examiner*—Kevin Kim
(74) *Attorney, Agent, or Firm*—Dov Rosenfeld; Inventek

(57) ABSTRACT

A configurable Viterbi decoder to decode a coded signal for inclusion in a radio receiver for implementing the physical layer receiving function (PHY) of a wireless data network. The decoder includes a branch metric generator with an input to the coded signal, an ACS subsystem coupled to the branch metric generator, and a survivor memory unit coupled to the ACS subsystem. The decoder includes a plurality of outputs each providing a decoded version of the input signal decoded to a distinct decision depth such that the Viterbi decoder is programmable to decode the signal to one of a plurality of decision depths.

10 Claims, 5 Drawing Sheets

ADAPTIVE VITERBI DECODER FOR A WIRELESS DATA NETWORK RECEIVER

RELATED PATENT APPLICATIONS

This invention claims priority of the following U.S. provisional patent applications:

Ser. No. 60/277,370 titled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH, filed: Mar. 19, 2001.

Ser. No. 60/283,609 titled WIRELESS COMMUNICATION SYSTEM, filed: Apr. 13, 2001.

Ser. No. 60/322,415 titled ADAPTIVE VITERBI DECODER FOR A WIRELESS DATA NETWORK RECEIVER, filed: Sep. 14, 2001.

Such provisional patent applications are incorporated herein by reference.

BACKGROUND

This invention is related to wireless devices, and in particular to a configurable Viterbi decoder for timely demodulation and decoding of packets in a wireless data network receiver.

Wireless technology is well known and widely used. Networks, such as local area networks are also well known and commonly used. Recently, there has been a lot of effort to implement wireless data networks, in particular wireless local area networks (WLANs). There is a desire to make these networks faster and faster.

John D. O'Sullivan, et al., describe portable computer wireless local area network devices that operate in excess of 10 GHz in U.S. Pat. No. 5,487,069, issued Jan. 23, 1996, (herein "O'Sullivan '069"). One object of such devices is to allow portable computer users to access the enterprise's LAN untethered and from any location in several buildings on a campus. A method of converting data into symbols that are used to modulate the radio carrier is offered by O'Sullivan '069 to overcome the problems inherent in spread spectrum systems. The use of symbols establishes many parallel sub-channels that each has modulation periods much longer that any multipath delays that might confuse demodulation. Such Patent is incorporated herein by reference. In effect, O'Sullivan '069 describe the basic coded orthogonal frequency division multiplexing (COFDM) called for in the recently adopted IEEE-802.11a wireless LAN standard.

Carrier frequencies in the ultra-high frequency (UHF) radio bands and above can naturally carry very high modulation rates, so more data bandwidth is inherently available.

The IEEE-802.11a packets begin with a preamble used for synchronization and timing, followed by the data fields. The data fields are prepended by a header field containing information that describes how the rest of the packet—the payload—is modulated and encoded. The header must be demodulated and decoded before any attempt can be made to demodulate and decode the payload.

A typical radio receiver/transmitter (transceiver) and modulator/demodulator (modem) together implement the functions of the physical layer of a network. The modem is coupled to a media access controller (MAC) that provides the next highest level functions in a layered network model. Because of the high data rate, the modem must pass information to the MAC about packets very fast. Thus, an IEEE 802.11a standard and similar high-speed wireless data networks require that the receive processing latency must be very small. The receive processing latency is defined as the time from when the received RF energy finishes on the channel, to when the last byte of data in that packet is demodulated and passed to the MAC. In the IEEE 802.11a standard, the receive processing latency must be less than 12 microseconds. This is a stringent requirement.

The strict receive processing latency requirement is sometimes at odds with other requirements of a data network standard such as the IEEE 802.11a standard. For example, this standard provides for various data rates, and the higher data rates use a higher level of coding and more complex modulation such as 64-QAM. Demodulating and decoding such high rate information requires more processing that typically takes longer; this further complicates meeting the strict receive processing latency requirement.

Decoding is often carried out using a Viterbi decoder. The Viterbi decoder itself takes time to decode a signal. Because the header itself must be demodulated and decoded before any attempt can be made to demodulate and decode the payload, the samples of the payload must be buffered in a buffer memory until the information on how to demodulate and decode the payload is available. This takes time, contributing to the overall processing latency of the receiver. Furthermore, the memory requirements of the buffer are expensive.

There thus is a need for an apparatus and method to reduce the time required to decode the header information. In particular, there is a need for a fast Viterbi decoder that rapidly decodes data received in a WLAN.

In order to meet standards, a radio receiver might be required to support many different data rates, and each data rate may involve a different type of coding and a different coding rate. The decoder of the radio receiver typically, therefore, has a decoding latency—the amount of time and memory required to decode the signals. To be able to decode all the supported data rates, the decoder of the radio receiver typically is configured to be able to decode the highest data rate signals, and so has a relatively high decoding latency.

There thus is a need for an adaptive decoder that adapts to the data rate of the signal such that the decoding latency for signals of one or more data rates lower than the highest supported data rate are reduced.

For more information on the IEEE 802.11 and IEEE 802.11a standards, see: ANSI/IEEE Std 802.11, 1999 Edition (ISO/IEC 8802–11:1999) Local and metropolitan area networks-Specific Requirements-Part 11: Wireless LAN Medium Access Control (MAC) and Physical Layer (PHY) Specifications, and IEEE Std 802.11a-1999 [ISO/IEC 8802–11: 1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at several locations, including from the IEEE (www.IEEE.org) and in particular at http://grouper.ieee.org/groups/802/11/index.html.

SUMMARY

One embodiment described herein is a configurable Viterbi decoder. The Viterbi decoder can decode a coded signal in a radio receiver that implements the physical layer receiving function (PHY) of a wireless data network. The Viterbi decoder includes a branch metric generator with an input from the coded signal, an add-compare-select (ACS) subsystem coupled to the branch metric generator, and a survivor memory unit coupled to the ACS subsystem. The decoder includes a plurality of outputs each providing a decoded version of the input signal decoded to a distinct decision depth such that the Viterbi decoder is programmable to decode the signal to one of a plurality of decision depths.

In one embodiment, the survivor memory includes a plurality of registers in a register exchange architecture. Each of the decoder outputs is a tap to one of the registers. One embodiment further includes a selector having a select input and a selected signal output, with the plurality of decoder outputs coupled to the selector. The selector selects as the selected signal output one of the decoder outputs according to the select input.

Also disclosed is a method of decoding data, applicable to decoding a data packet of a wireless data network received in a wireless receiver. In such an application, the packet includes data coded at one or more of a set of data rates and modulated according to one of a set of modulation schemes. The packet has a structure that includes one or more header symbols containing information on the data rate and modulation scheme of the payload. The header symbols are encoded at a first data rate and use a first modulation scheme. The method includes receiving the received packet, sampling the received signal of the packet to form a sampled signal, and demodulating the sampled signal to form a demodulated signal. The demodulated signals are buffered in a buffer of a length long enough to buffer input data while a decoder decodes the one or more header symbols. The one or more header symbols are decoded in an adaptive Viterbi decoder that has a number of settable decision levels while the decoder is set to decode at a first decision level suited for decoding signals coded at the first data rate. The data rate of the remainder of the received packet is determined from the one or more header symbols, and the Viterbi decoder is set to decode at a level suitable for the remainder of the packet.

Other aspects, features, and advantages will be clear from the detailed description.

DETAILED DESCRIPTION

Figure 1:
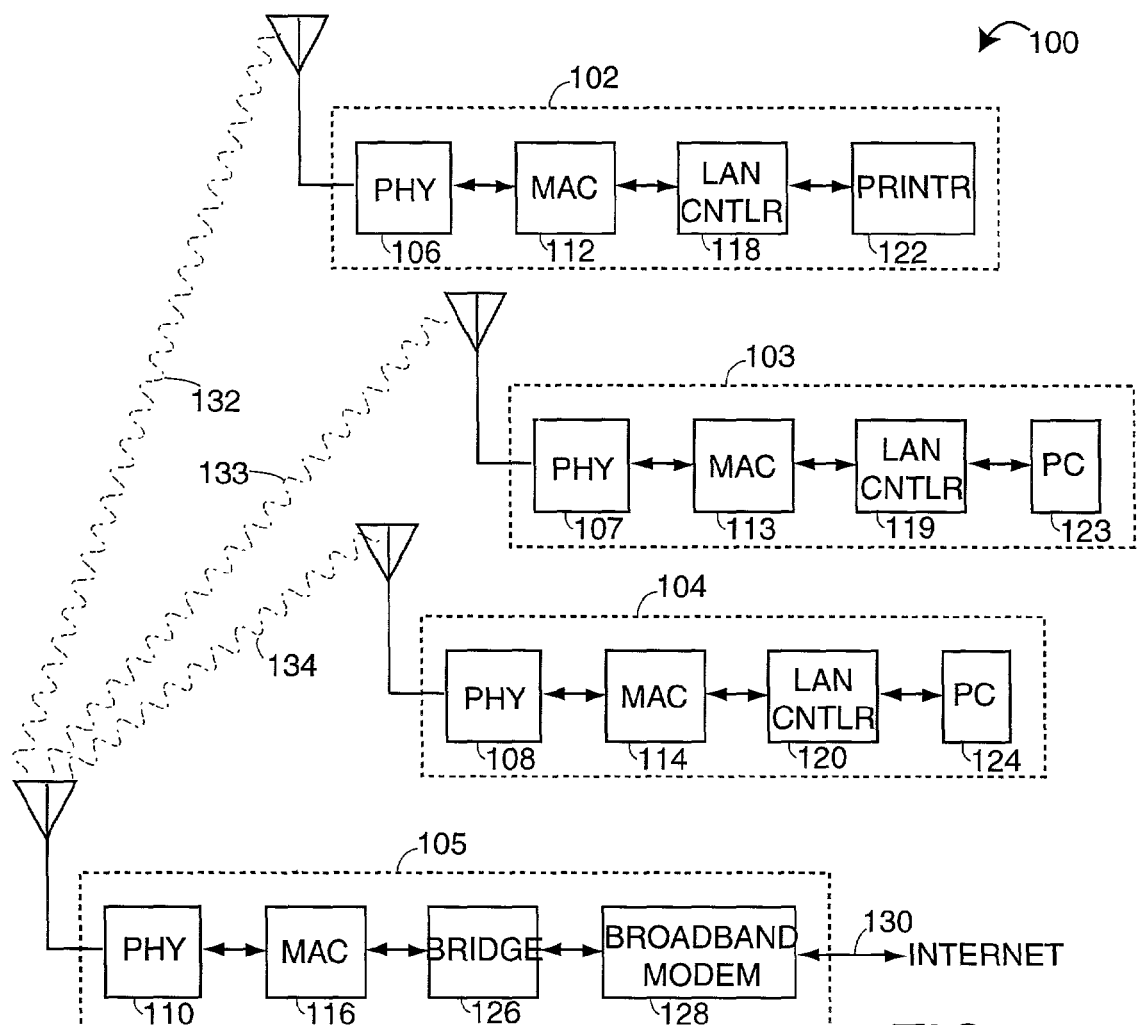
FIG. 1 is a functional block diagram of a wireless communication system that includes an embodiment of the present invention.

FIG. 1 diagrams a wireless computer data network in which embodiments of the present invention may be used, and is referred to herein by the general reference numeral 100. The network 100 includes a plurality of wireless appliances represented by units 102, 103 and 104, and may also include at least one base station, i.e., an access point connected to the Internet, e.g., represented here by access point 105. One or more of the wireless appliances may be mobile. Network 100 preferably operates according to an industry networking standard. For example, the IEEE-802.11 standard defines protocols for two types of networks, ad hoc and infrastructure networks. An ad hoc network is a simple network where communications are established directly between any two stations in a given coverage area without the use of an access point. The IEEE-802.11 standard specifies the etiquette that each station must observe so that they all have fair access to the wireless medium, and provides methods for arbitrating requests to use the medium to ensure that throughput is maximized for all of the users in the base service set. An infrastructure network, e.g., in PCF (Point Control Function) mode, uses an access point for allocating the transmit time for all stations. The access point is also used to handle traffic from the wireless LAN to the wired or wireless backbone of an overall network, e.g., the Internet or an intranet. This arrangement allows for coordination of all of the stations in the WLAN and ensures proper handling of the data traffic. Typically, wireless local area networks (WLANs) controlled by a central access point will provide better throughput performance.

The license-free national information structure (U-NII) radio spectrum bands in the United States are assigned to 5.15–5.25, 5.25–5.35, and 5.725–5.825 GHz, and are preferred for use in the network 100 for wireless ad hoc LAN communication. The IEEE-802.11a protocol includes a training sequence built on a preamble that provides sufficient information to allow frequency and timing estimation as well as channel estimation to enable a receiver to lock-on to the carrier and allow data demodulation. All transmissions occur in bursts, so the receivers must find lock each time a burst commences.

A physical layer interface (PHY) 106, 107, 108, and 110, provides each of the wireless interconnections. A media access controller (MAC) 112, 113, 114, and 116, provides the next interface layer in a layered communications model. A local area network controller 118, 119, and 120 is provided as a peripheral to a personal computer (PC) 123, 124 and, in this example, a printer 122. The PCs can each be a computer workstation or a laptop that belongs to an employee in a business environment, and even to an individual in his or her homes. In one application, the access point 105 is installed in a hotel and the other units 103 and 104 are independent guests who have checked-in and are allowed to access the Internet as part of their room charges. Unit 102 can be a printer.

A bridge 126 interfaces the wireless local area network through a broadband modem 128 to the Internet 130. The broadband modem 128 can be implemented with DSL, ISDN, or even two-way satellite connections like Starband (www.starband.com).

A plurality of radio communications, represented by radio links 132, 133, and 134, preferably use forty-eight active tones and four pilot tones in 64-tone discrete Fourier transform coded orthogonal frequency division multiplexing (COFDM). The modulation may be one of several modulation schemes allowed, such as quadrature phase shift keying QPSK, 16QAM and 64QAM. The modulated signals are transmitted in the 5 GHz frequency band. Several modulation schemes are described in detail in the IEEE-802.11a standard (www.ieee.com). Note that in an ad hoc network, there may be direct radio links between the units 122, 123, and 124.

Figure 2:
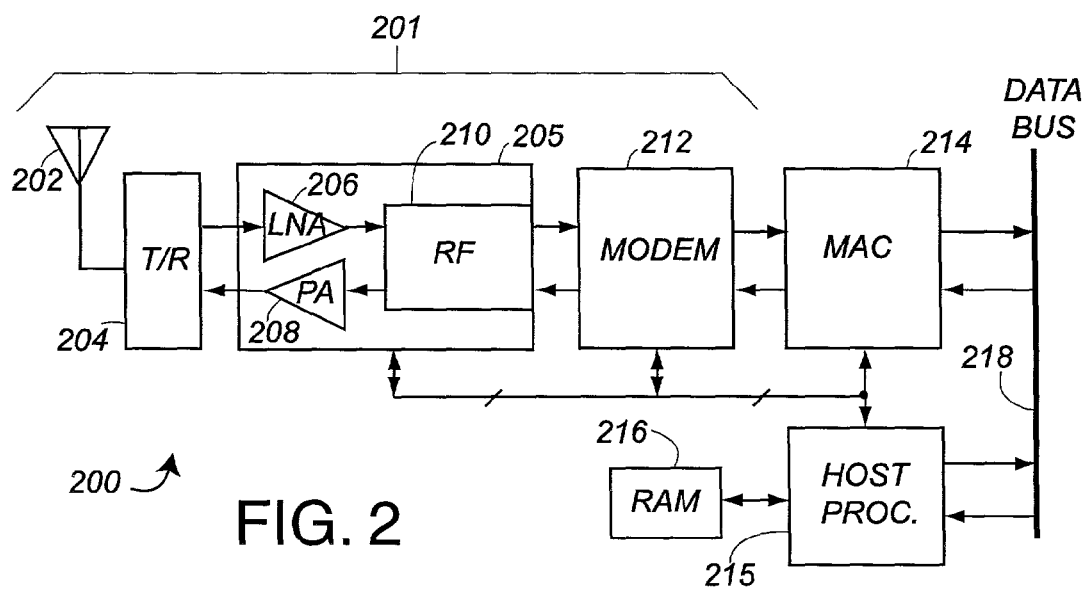
FIG. 2 is a functional block diagram of a wireless communication system that includes an embodiment of the present invention.

FIG. 2 is a functional block diagram of a wireless communication system 200 that includes an embodiment of present invention. The system 200 might be, for example, part of a PCMCIA wireless LAN card embodiment, and includes a physical layer interface (PHY) 201 that includes at least one antenna 202 for 5 GHz carrier service, a transmit/receive (T/R) switch 204 for half-duplex operation, and a wireless transceiver 205 that includes a low-noise amplifier (LNA) 206, a power amplifier (PA) 208, and other radio frequency (RF) transmit and receive components (210) to implement a transceiver. One embodiment includes antenna diversity. The physical layer also includes a data modem 212 that codes and modulates the signals for transmission by the transceiver, and that demodulates and decodes the signals received by the transceiver. The system 200 further includes a media access controller (MAC) 214 for layer-2 processing. A computer system databus 218 is accommodated. Interfaces may be included e.g., one or more interfaces that conform to well-known industry standards PCMCIA, PCI, USB, and so forth.

One optional component is a host processor 215. The host processor function may, for example be incorporated with the MAC 214. A random access memory (RAM) 216 is included for data buffering and program storage. The RAM 216 may be directly coupled to the host or to the MAC or to both.

In addition to the radio data between the modem, radio transceiver, and MAC, control information such as gain settings for the radio receiver from an automatic gain control module in the modem, and other data, may be communicated between the host (if included), the MAC, the modem and the wireless transceiver.

The system 200 is preferably implemented to be compatible with the IEEE-802.11 a standard for wireless local area network (LAN) applications. The RF transceiver 205 and modem 212 constitute a complete wireless engine for OSI Layer-1 physical layer (PHY) functionality in wireless LANs. The MAC 214 is IEEE-802.11-compliant for layer-2 processing. Supportable data rates have been tested to exceed 54 Mbits/second.

Given the present state of semiconductor technology development, the system 200 is preferably constructed on a single printed circuit board (PCB) and the RF transceiver 205 and modem 212 are each implemented with CMOS technology in individual integrated circuits. The present inventors have discovered that 0.25-micron CMOS technology is practical for use in implementations of the modem 212, and 0.18-micron CMOS technology for the RF transceiver 205. One such silicon foundry that has the capability to manufacture such parts is Taiwan Semiconductor Manufacturing Co., Ltd.

The Modem Chip

Figure 3:
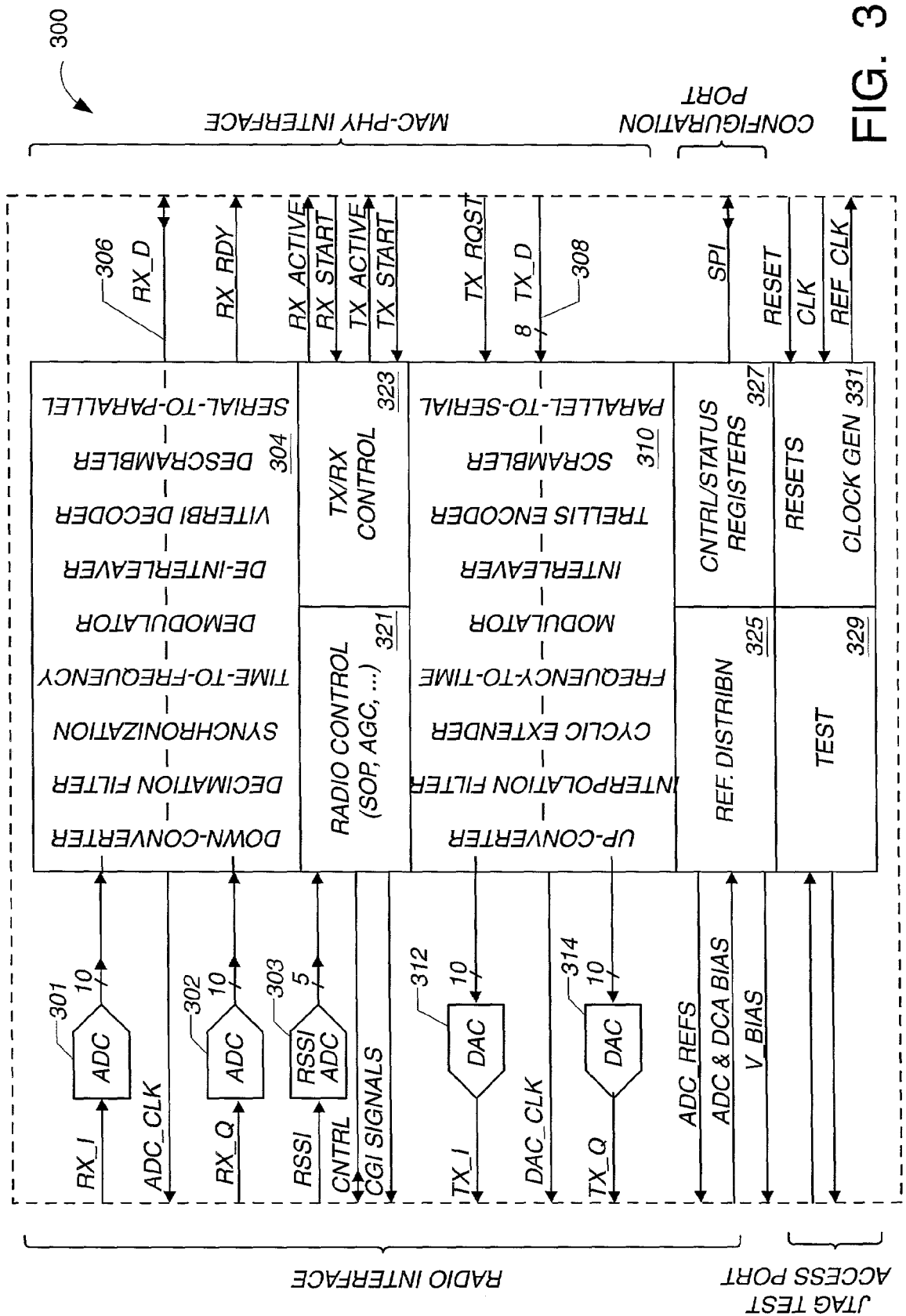
FIG. 3 shows a block diagram of a modem integrated circuit that includes an embodiment of the present invention.

FIG. 3 shows in simplified block diagram form, an embodiment 300 of the modem chip that can operate with the RF transceiver 205 and that includes an embodiment of the present invention. ADCs 301 and 302 accept fully differential I and Q analog signals from one embodiment of the RF transceiver 205, or one of the ADCs accepts a single differential signal from a single sideband embodiment of the RF transceiver 205. The receive signal processor 304 accepts the digitized receive signals from ADCs 301 and 302 and carries out the following operations: down-conversion, anti-alias filtering, OFDM symbol synchronization, time-to-frequency conversion, sub-carrier demodulation, de-interleaving, Viterbi decoding according to an embodiment of the present invention, descrambling, and serial-to-parallel conversion. The output 306 of the receive processor 304 goes to an off-chip MAC processor.

The receive input of modem 300 can interface to two basic receiver configurations of different versions of the RF transceiver 205.

1. A quadrature radio receiver with baseband I and Q differential outputs, which are sampled at 40 Ms/s by the ADCs. In such a case the ADC outputs are filtered by 2:1 decimating filters in the receiver signal processor 304.
2. A bandpass IF radio receiver with real bandpass IF differential output centered at 20 MHz. The analog input from the transceiver chip is sampled at 80 Ms/s by one ADC and an internal IQ down-converter in processor 304 generates baseband I and Q channel outputs. The decimating filters are configured as a 4:1 decimating low-pass filters.

In one embodiment, the transmit and receive data paths in modem 300 are completely independent, allowing full-duplex as well as half-duplex operation.

Note that one embodiment of the modem chip is only for operation with a bandpass IF radio receiver, so that only a single differential ADC, rather than the two ADCs 301 and 302 shown in FIG. 3 is included for the receive path. The analog input from the transceiver 205 is sampled at 80 Ms/s by that ADC and an internal IQ down-converter with decimation filters in processor 304 generates baseband I and Q channel outputs. The decimating filters are configured as a 4:1 decimating low-pass filters.

The to-be-transmitted signal 308 from the MAC is input to a transmit processor 310 that performs parallel-to-serial conversion, scrambling, encoding, bit-interleaving, sub-carrier modulation, OFDM time symbol generation, cyclic extension, filtering and up-conversion. The resulting digital signals are converted to analog I and Q signals by digital-to-analog converters 312 and 314. These analog signals are input to the RF transceiver 205.

The architecture shown in FIG. 3 supports all the raw data rates and modulation schemes specified by IEEE 802.11a, mandatory and optional, plus three additional proprietary configurations.

In one embodiment, operation of the modem 300 is controlled and monitored by a set of 48 16-bit control and status registers that are accessed via a 4-pin Serial Peripheral Interface (modem SPI).

The radio receiver is controlled by radio control block 321 that includes start-of-packet (SOP) detection and automatic gain control (AGC) for dynamically setting the gains and the performance of the transceiver. The SOP and AGC functions may be as described in U.S. provisional patent application 60/322, 382 filed Sep. 14, 2001, titled AUTOMATIC GAIN CONTROL AND LOW POWER START-OF-PACKET DETECTION FOR A WIRELESS LAN RECEIVER to inventors Ryan et al., and assigned to the assignee of the present invention. The receive and transmit functions of the modem are controlled by an RX/TX control block 323 that both provides controlling the function of the modem under control of the off-chip MAC controller and that provides control signals to the off-chip MAC controller.

The modem also includes a modem gain control interface (modem GCI) in radio control 321 that outputs gain parameters to a radio receiver. The gain control interface is a serial transmit-only port for setting gains, used, for example, to dynamically adjust transceiver receive path gain to optimize the received signal to noise ratio. In one embodiment, the GCI also provides a mechanism for controlling the transmit power level of a radio transmitter connected to the modem by selecting from one of nine configurations for the power amplifier of the transmitter. The modem GCI functions with a receive-only transceiver GCI that is in the transceiver chip.

In order to keep the power consumption of the modem chip low, the analog to digital converters are only kept on when necessary. Thus there are RUN/STANDBY signals for each of the ADCs 301 and 302. Furthermore, there are controlled bias circuits for the analog components of the modem chip that provide for switching bias currents on and off from different subsections of the modem chip, and that also provide for switching the bias current from a first level to a second level.

The functions of the modem of FIG. 3 are controlled by several finite state machines (FSMs). In one embodiment, a 16-bit microcontroller also is included.

The OFDM Packet

Figure 4:
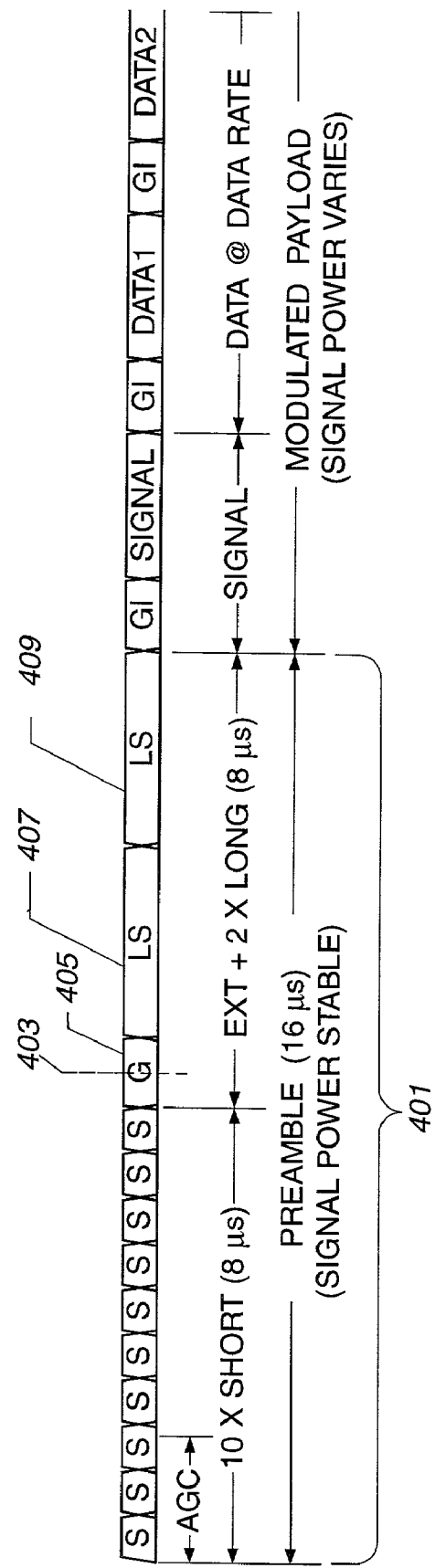
FIG. 4 shows an OFDM packet structure conforming to the 802.11a standard.

FIG. 4 shows the structure of a OFDM packet as used in IEEE 802.11a WLANs. The packet starts with a preamble 401 used for SOP detection, AGC, diversity selection when diversity is used, and various other synchronization functions. The preamble is followed by the modulated payload, which starts with a known (low) data rate SIGNAL field and DATA fields. The SIGNAL field includes information on the coding and the data rate of the data. Each DATA field also includes a guard interval GI (cyclic extension) to make up a data frame of the packet.

The following describes a typical transmit sequence process to generate data packets such as that of FIG. 4 that conform to the IEEE 802.11a standard. To generate a data packet for transmission:

(a) Produce the physical layer convergence protocol (PLCP) preamble field, composed of 10 repetitions of a "short training sequence" (used for AGC convergence, diversity selection, timing acquisition, and coarse frequency acquisition in the receiver) and two repetitions of a "long training sequence" (used for channel estimation and fine frequency acquisition in the receiver), preceded by a guard interval (GI).

(b) Produce the PLCP header field using RATE, LENGTH, and SERVICE information by filling the appropriate bit fields in the header. The allowed values for the LENGTH parameter are in the range of 1–4095. This parameter is used to indicate the number of octets in the MAC protocol data unit (MPDU) which the MAC is currently requesting the PHY to transmit. This value is used by the PHY to determine the number of octet transfers that will occur between the MAC and the PHY after receiving a request to start the transmission. The RATE parameter describes the bit rate at which the PLCP shall transmit the PLCP service data unit (PSDU). Its bit rate value can be any of the rates 6, 9, 12, 18, 24, 36, 48, or 54 Mbits/sec (Mbps). Support for data rates of 6, 12, and 24 Mbps are mandatory. The SERVICE parameter consists of 7 null bits used for the scrambler initialization and 9 null bits reserved for future use. The RATE and LENGTH fields of the PLCP header are encoded by a convolutional code at a rate of R=½, and are subsequently mapped onto a single BPSK encoded OFDM symbol, denoted as the SIGNAL symbol (See FIG. 4). The encoding of the SIGNAL field into an OFDM symbol follows the same steps for convolutional encoding, interleaving, BPSK modulation, pilot insertion, Fourier transform, and prepending a GI as described subsequently for data transmission at 6 Mbit/s (Mbps). The contents of the SIGNAL field are not scrambled.

(c) Calculate from the RATE field the number of data bits per OFDM symbol ($N_{DBPS}$), the coding rate (R), the number of bits in each OFDM subcarrier ($N_{BPSC}$), and the number of coded bits per OFDM symbol ($N_{CBPS}$).

(d) Append the PSDU to the SERVICE field. Extend the resulting bit string with "zero" bits (at least 6 bits) so that the resulting length will be a multiple of $N_{DBPS}$.

(e) Initiate the scrambler with a pseudo-random non-zero seed, generate a scrambling sequence, and XOR it with the extended string of data bits.

(f) Replace the six scrambled "zero" bits following the "data" with six nonscrambled "zero" bits. Those bits return the convolutional encoder to the "zero state" and are denoted as "tail bits."

(g) Encode the extended, scrambled data string with a convolutional encoder (R=½). Omit some of the encoder output string to reach the desired "coding rate." That is, "puncture" according to a "puncturing pattern." Puncturing is a procedure known for omitting some of the encoded bits in the transmitter, thus reducing the number of transmitted bits and increasing the coding rate, and inserting a dummy "zero" metric into the convolutional decoder on the receive side in place of the omitted bits. While not required, decoding by the Viterbi algorithm is recommended.

(h) Divide the encoded bit string into groups of N CBPS bits. Within each group, perform an "interleaving" (reordering) of the bits according to a rule corresponding to the desired RATE.

(i) Divide the resulting coded and interleaved data string into groups of $N_{CBPS}$ bits. For each of the bit groups, convert the bit group into a complex number according to the modulation encoding tables.

(j) Divide the complex number string into groups of 48 complex numbers. Each such group will be associated with one OFDM symbol. In each group, the complex numbers will be numbered 0 to 47 and mapped hereafter into OFDM subcarriers numbered −26 to −22, −20 to −8, −6 to −1, 1 to 6, 8 to 20, and 22 to 26, respectively. The subcarriers −21, −7, 7, and 21 are skipped and, subsequently, used for inserting pilot subcarriers. The "0" subcarrier, associated with center frequency, is omitted and filled with zero value.

(k) Insert four subcarriers as pilots into positions −21, −7, 7, and 21. The total number of the sub-carriers is 52 (48+4).

(l) For each group of subcarriers −26 to 26, convert the subcarriers to time domain using inverse discrete Fourier transform. Prepend to the Fourier-transformed waveform a circular extension of itself thus forming a GI, and truncate the resulting periodic waveform to a single OFDM symbol length by applying time domain windowing.

(m) Append the OFDM symbols one after another, starting after the SIGNAL symbol describing the RATE and LENGTH.

(n) Up-convert the resulting "complex baseband" waveform to an RF frequency according to the center frequency of the desired channel and transmit.

The Receive Chain

Figure 5:
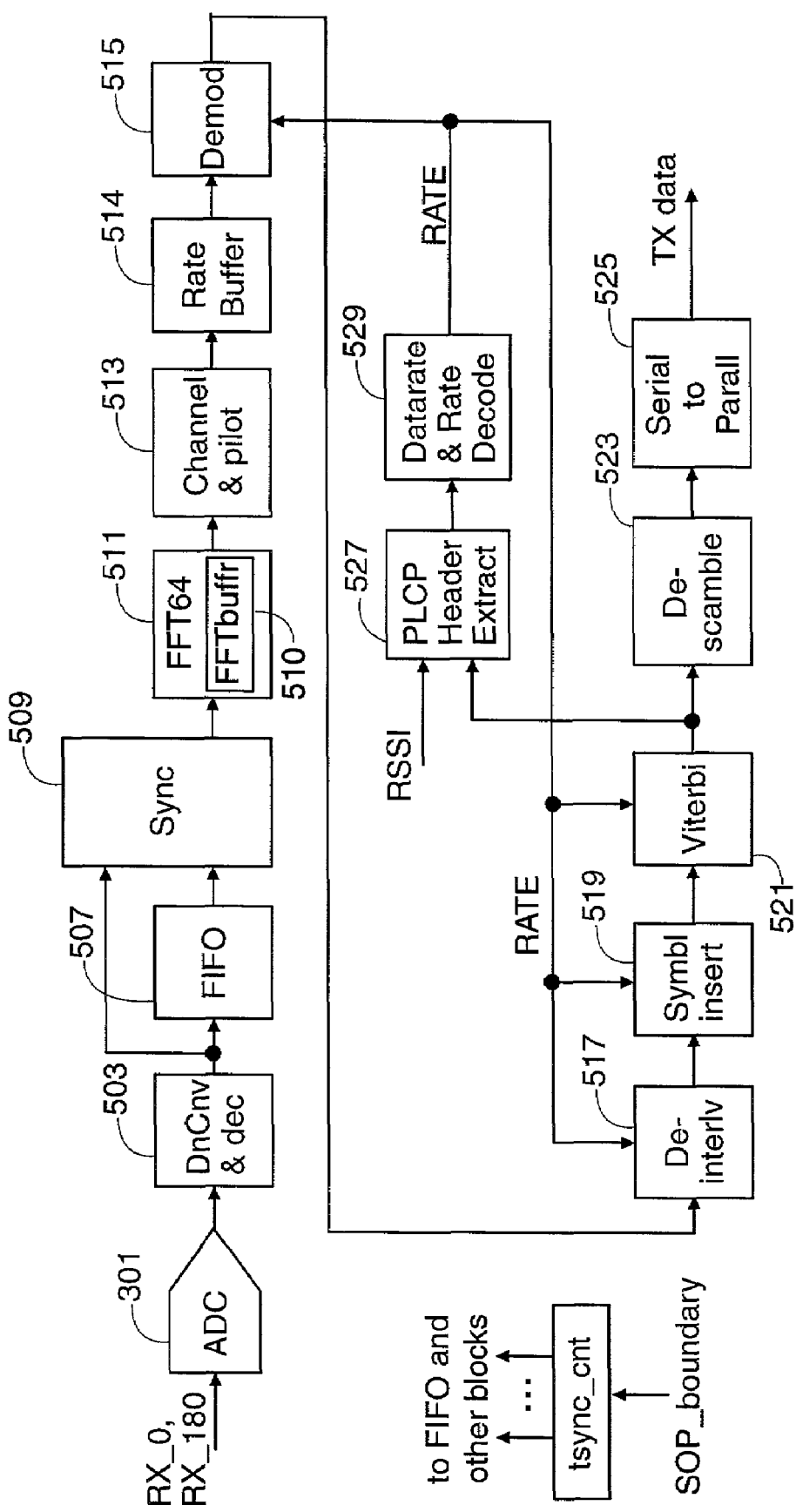
FIG. 5 shows a simplified block diagram of the receive processing chain of the modem of FIG. 3, including a Viterbi decoder according to one embodiment of the invention.

FIG. 5 shows a simplified block diagram of the receive chain of the modem embodiment of FIG. 3. After sampling and decimation (block 503) by ADC 301, I and Q samples at 20 Msamples/sec are fed to a buffer (a FIFO) 507 implemented as a delay line 507 and also to the time synchronization unit 509. The FIFO is a standard FIFO except that the output I and Q samples may be taken from several selected points within the buffer, and may also be read out at a rate higher than the input sample rate to clear the buffer.

An AGC unit within Radio control unit 321 (FIG. 3) generates a signal SOP_boundary to indicate the start of packet boundary. The modem includes a master counter tsync_cnt that is triggered by the SOP_boundary signal and counts samples. Above-mentioned U.S. patent application Ser. No. 60/322,382, titled AUTOMATIC GAIN CONTROL AND LOW POWER START-OF-PACKET DETECTION FOR A WIRELESS LAN RECEIVER to Ryan et al. describes one embodiment of the AGC method and apparatus, and one method of generating SOP_boundary. U.S. patent application Ser. No. 60/354,344, titled AUTOMATIC GAIN CONTROL AND START-OF-PACKET DETECTION FOR A WIRELESS LAN RECEIVER to Ryan et al., describes other embodiments.

Synchronization is achieved by one or more methods such as estimating the short preamble's short symbol timing using a correlator and estimating the guard interval timing of the long preamble. The synchronization unit further includes frequency estimation and frequency correction using a rotator.

For the first 16 samples, the FIFO 507 output is unused. For the next 16 samples, synchronization unit 509 includes coarse frequency estimation and correction that requires that samples be delayed by a short symbol. Therefore the read address of the FIFO 507 is initialized 15 samples behind the write address. Synchronization unit 509 also includes fine frequency estimation that starts after coarse frequency estimation is complete, at tsync_cnt=31. In one embodiment, this requires that samples be delayed by two short symbols. A delay change is signaled to the FIFO 509 and the read address decreases by 15 instead of increasing by unity. Correct timing also is determined in synchronization unit 509 using one or more correlators that generate a pulse called corr_boundary when timing is determined. After fine frequency, the buffer output is not needed until the timing has been determined. The outcome of timing estimation (corr$_{13}$boundary) nominally appears 17 samples after the guard interval that occurs between the short and long preamble (see FIG. 4) is actually detected. The corr_boundary signal causes another delay change, and the read address of the FIFO is decreased by 45−31=14 instead of increasing by unity. This delay change compensates for the 15 sample latency in detecting the guard interval and making the change.

Accordingly, the first, second, third and so forth samples out of the FIFO after the delay change should be the first, second, third and so forth samples from the second half of GI2. This is true except for the first sample, since its address was calculated before the delay change.

These output samples are passed through a phase rotator in synchronization unit 509 that corrects the samples. The output of the synchronization unit 509 is presented to an input buffer 510 (FFTbuffr) of an FFT unit 511 (FFT64) for time to frequency conversion.

Since no processing occurs until the input buffer 510 of the FFT64 unit is full, the transfer rate out of the FIFO may be increased at this point, e.g., doubled. This reduces latency. Samples are read out of the FIFO into the FFT64 unit 511 at a higher rate, e.g. at twice the rate that they are written into the FIFO 507, so that the FIFO 507 is flushed or collapsed. The higher-rate flushing continues until the FIFO 507 is empty, signaled by the write address matching the read address.

In this way, the FIFO 507 introduces a temporary latency, but this latency is removed long before the end of packet is reached.

In one embodiment, the FFT process of FFT64 unit 511 is started a settable number of samples (called sof_offset) into a frame. In one embodiment, the FFT of frames starts halfway through the guard interval (16 samples before the start of the first long symbol) and three quarters of the way through the first long symbol (16 samples before the start of the second long symbol). Timing estimation in synchronization unit 509 signals the start of the long symbol frames by two pulses. The first is issued after sof_offset+5 samples; the second is issued another 64 samples later. The start of the signal frame is identified by a pulse data_start, which is generated by synchronization unit 509 after a further 64 samples. In the case of all three pulses, the +5 term accounts for the delay introduced by the rotator.

The FFT64 block 511 in FIG. 5 transforms the complex baseband time-domain samples of the long training symbols of the preamble plus the data-carrying OFDM symbols of the received packet into complex frequency domain samples. Inputs to FFT64 are blocks of 64 complex samples of the received signal processed in natural time order. Outputs are blocks of 64 complex frequency samples in bit-reversed frequency order.

In an IEEE802.11 a compliant operation, 80 samples are transmitted per OFDM symbol. Intersymbol interference (ISI) due to signal dispersion in the channel and multi-path reception corrupts early samples in the received block of 80 samples. Delay spread due to multi-path reception typically has an exponential delay-time profile. Residual carrier frequency drift can be positive or negative. To provide good performance in the presence of these effects, the 64 samples selected from each received OFDM time-domain symbol are centered in the middle of the samples uncorrupted by ISI.

The IQ frequency domain samples from FFT64 511, in bit-reversed frequency order, are now input into a channel response estimation and correction block 513. Block 513 includes a rectangular-to-polar converter—a Cordic in one embodiment—to convert the IQ frequency samples into polar coordinate form before being processed by channel response estimation circuits in block 513. Block 513 further includes channel equalization circuits, a null channel detection circuit, a pilot tone correction unit, and a second coordinate converter to convert the output from polar to rectangular coordinates. The output is thus a sequence of IQ frequency samples for demodulation by a demodulator 515.

A rate buffer block 514 is included before the samples are input into the demodulator. The rate buffer 514 is a switchable FIFO which buffers the received frequency samples from the end of the SYMBOL field for a number N of clock cycles, where N is the latency (in clock cycles) through the demodulator, deinterleaver, and Viterbi decoder of the modem. The rate buffer block 514 is included because the SYMBOL field, which is always transmitted as rate ½ BPSK, determines the modulation type and coding rate of the remainder of the packet. This information is then used to set up the demodulator and Viterbi decoder parameters before the remainder of the packet is input to the demodulator chain. Hence, the remainder of the packet needs to be buffered until the RATE information has been successfully decoded.

One aspect of the invention is reducing the length of the rate buffer 514 by reducing the Viterbi decoder latency for processing the data in the SYMBOL field relative to the Viterbi processor latency for processing the remaining payload frames in the packet.

The demodulator 515 performs the opposite of the mappings performed during the modulation step. Initially, the demodulator is set to act as a BPSK demodulator to demodulate the SYMBOL field. Once the RATE and, thus, the modulation scheme are determined, the demodulator is set to demodulate the appropriate modulation scheme.

The demodulated symbols are de-interleaved by de-interleaver 517 that performs the opposite of the interleaving done by the transmitter. The interleaving depends on the data rate and associated modulation, thus, initially, it is assumed that the SYMBOL field (rate ½ BPSK) is being processed. Once the modulation scheme and coding rate of the remainder of the packet is determined, the RATE is set to the appropriate rate and the de-interleaver is set to perform its correct function.

In one embodiment, the output of de-interleaver 517 is a sequence of samples of both I and Q fed to a symbol inserter 519. The symbol inserter 519 inserts dummy symbols into the received bit stream to reconstruct the rate ¾, ⅔, and ⅞ punctured codes to a rate-½ format suitable to the inventive Viterbi decoder 521 of the modem embodiment of FIG. 3, which is a rate-½ Viterbi decoder. The symbol insertion process is the opposite of the code puncturing process used in the transmitter. The inserted dummy symbols lie in the center of the received signal constellation so that they convey no statistical information to the Viterbi decoder.

claim The inventive Viterbi decoder is described further below. During processing of the SYMBOL field, the output of the Viterbi decoder is monitored by a PLCP header extractor 527 that extracts the RATE information from the SYMBOL field. This information is decoded by a modulation and rate decoder unit 529 to determine the RATE that also determines the modulation scheme. The RATE information is fed to the demodulator 515, de-interleaver 517, and symbol inserter 519 units, as well as back to the Viterbi decoder.

Once the payload is decoded by the Viterbi decoder 521, its output is de-scrambled in unit 523 and converted to parallel form in unit 525 for transmission to the MAC unit.

The Viterbi Decoder

Figure 6:
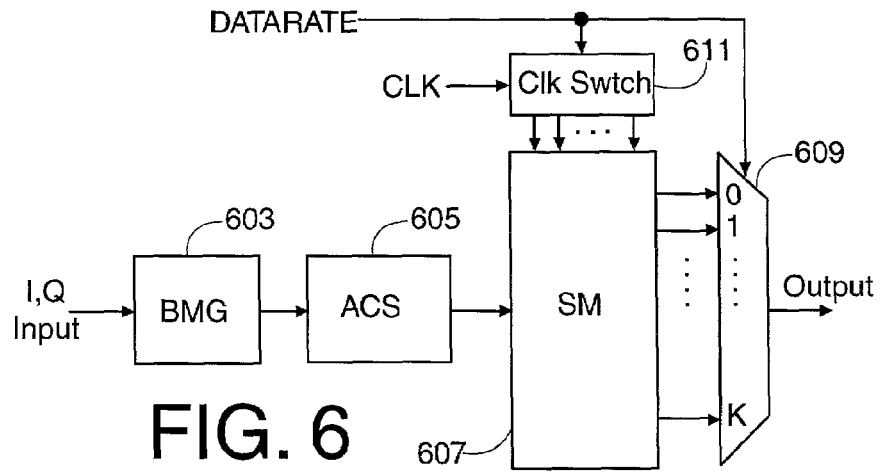
FIG. 6 shows a simplified block diagram of a Viterbi decoder according to one embodiment of the invention.

In one embodiment, the Viterbi decoder 519 is a 64-state rate-½ decoder. An embodiment on the Viterbi decoder 521 is shown in FIG. 6. The decoder 521 includes three blocks: a branch metric generator (BMG) 603 that accepts the coded input signal (I and Q), an add-compare-select (ACS) block 605 that accepts the output of the branch metric generator, and a survivor memory (SM) 607 that accepts the output of the branch metric generator for survivor branches. The Viterbi decoder accepts 4-bit I— subsystem and Q-inputs in 2's complement format. The decision depth of the decoder, which directly affects the latency through the block, is programmable, and during operation of the modem, is made dependent on the data rate of the input bits. Thus, as shown in FIG. 5, in one embodiment, the RATE information also is used by the Viterbi decoder.

Fully parallel arithmetic is used in the add-compare-select (ACS) processors of ACS subsystem 605. In one embodiment, the survivor memory 607 uses a register-exchange path memory architecture. As noted above, the receiver system as a whole implements coding rates other than ½ using puncturing; this is invisible to the Viterbi decoder.

In one embodiment, the branch metric generator 603 computes four branch metrics, denoted BM0, BM1, BM2 and BM3. Given an input values (s0, s1) each of s0 and s1 in the range 0 to 31 (inclusive), in one embodiment the branch metrics are calculated as follows:

$BM0 = s0 + s1$ $BM1 = 32 + s0 - s1$ $BM2 = 32 - s0 + s1$ $BM3 = 63$ if $(s0, s1) = (0,0)$ $64 - s0 - s1$ otherwise.

The ACS subsystem 605 includes 64 ACS units. In one embodiment, 63 instances of one ACS unit ("acs"), and one special instance of the first ACS unit, acs_zero is included. The only difference is that acs_zero resets its path metric to 0, while the others are reset to 210. Resetting path metric zero to "0" and the other path metrics to a high value such as 210 avoids the error probability for the first few decoded bits being higher than that of most of the bits in the packet.

Figure 7:
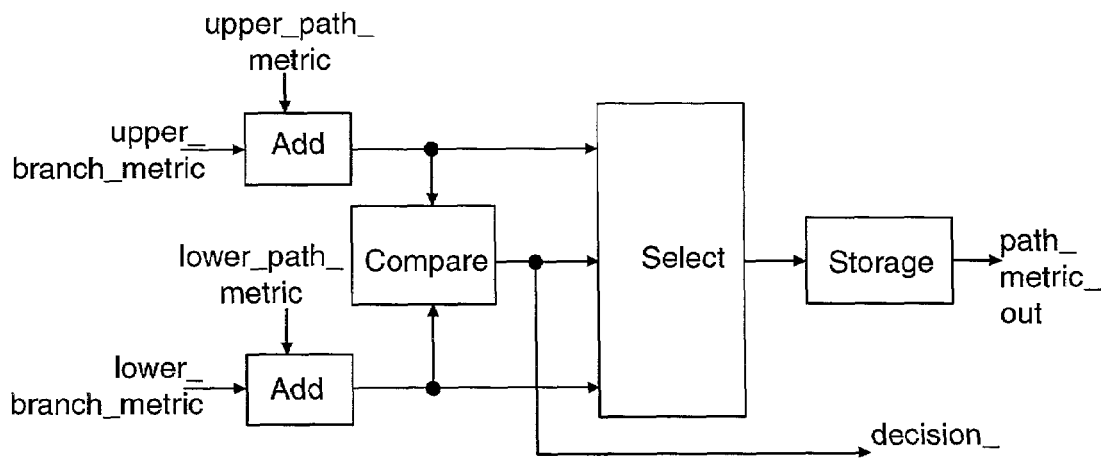
FIG. 7 shows a simplified block diagram of an ACS unit included in the ACS subsystem of the Viterbi decoder embodiment of FIG. 6.

A single ACS unit is shown in FIG. 7. The acs and acs_zero units each compute a path metric as shown in this drawing, which is similar to FIGS. 6–23 of Chapter 6 of George C. Clarke and J. Gibb Cain, *Error-Correction Coding for Digital Communications*, Plenum Press, 1991. The inputs to each ACS unit consist of two branch metrics (upper_branch_metric and lower_branch_metric), two path metrics (upper path_metric and lower path_metric) and clock, reset and enable signals (not shown). The two outputs of an ACS unit are a path metric (path_metric_out) and a single-bit decision output (decision_out).

The SM 607 is an implementation of a register exchange memory. See for example Lin, Shu, *Error control coding: fundamentals and applications*, Englewood Cliffs, N.J.: Prentice-Hall, 1983. The register exchange approach was chosen by the inventors over the traceback architecture because it provides for a lower latency at the same clock speed. An alternate embodiment of the invention uses the traceback architecture implemented with a RAM.

Figure 8:
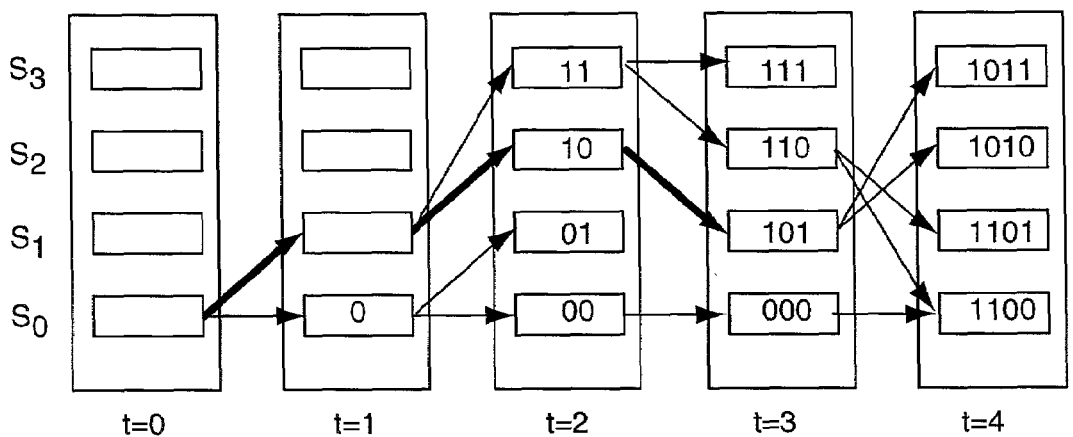
FIG. 8 shows a simplified block diagram of a simple register exchange system of a Viterbi decoder according to one embodiment of the invention.

In one embodiment, the register exchange memory 607 includes 128 registers providing a decision depth of up to 128 levels. The register records the decoded output sequence along the path starting from the initial state to the final state, which is the same as the initial state. A very simple case is presented here using FIG. 8 for the purpose of illustration. FIG. 8 includes a simple trellis diagram and a set of four registers at various times denoted by time index t. The register of state $S_1$ at t=3 contains 101. Note that the trellis follows along the bold path, and the decoded output sequence is 101. This approach eliminates the need for traceback; the register of the final state contains the decoded output sequence. Hence, the approach may offer a high-speed operation. In one embodiment, the decision depth of the register exchange block is 128.

One or more taps are provided at different depth levels. This enables the Viterbi decoder to be configurable to have different decision depth levels. A first embodiment includes a single such register output (a "tap") called short_out located after the 49th stage. Other embodiments have further taps. As shown in FIG. 6, the taps are input to a selector 609 that selects the depth level according to the rate/modulation information decoded from the SYMBOL field.

In order to reduce power consumption, the data rate/modulation information also is used in one embodiment to selectively switch the clock signal to the registers in memory 607. For low data rates, fewer registers are used, and those registers not used are not supplied with a clock signal.

Referring to FIG. 6, clock switch 611 is used to selectively switch the clock signal only to those registers of memory 607 that are used for the selected decision depth.

When an 802.11a packet is transmitted, the header (SYMBOL field) is mandated to be encoded with a highly redundant rate-½ code and modulated with a relatively error tolerant BPSK scheme. In the modem, during header decoding, the rest of the packet needs to be buffered—by rate buffer 514 in one embodiment—while the SYMBOL field is being processed to extract parameters that enable decoding the rest of the packet. The buffer requires memory. There is thus a desire to reduce the buffer size of rate buffer 514. The Viterbi decoder takes time to arrive at a decision; this time is termed the Viterbi latency. The higher the Viterbi latency, the more memory is required in the buffer 514. This Viterbi latency, i.e., how long it takes to decode the header field also contributes to the receiver latency time.

One aspect of the invention is using the Viterbi decoder in a very low latency mode to reliably recover the SYMBOL header in a relatively short time in order to reduce the overall receiver latency and to reduce buffer memory requirement. This aspect of the invention includes recognizing that the long decision depth required for high rate encoded data is not required for the header data. Thus, in one embodiment, the latency is reduced during decoding of the header. During this time, the short_out output after the 49th stage is used rather than the full set of registers. Furthermore, to further reduce processing, after the header is decoded, the register exchange block is not reset. The data output is not valid until 130 cycles after the first valid input, so it does not matter if 130-1 cycles of meaningless data come out at the beginning. This data is ignored.

In accordance with a second embodiment, more than one tap is provided in the register exchange block at various depth levels. Once the RATE is decoded, the tap to use, i.e., the decision depth of the Viterbi decoder is selected according to the RATE. Thus, the Viterbi decoder adapts to the data rate by selecting the decision depth for the data rate of the signal. This has the advantage of lowering the processing latency of the Viterbi decoder to that needed for the particular data rate. In one embodiment, the following taps are used for various data rates.

TABLE 1

| RATE | Modulation | Coding Rate | Decision Depth |
|---|---|---|---|
| 6 Mbps | BPSK | ½ | 48 |
| 9 Mbps | BPSK | ¾ | 64 |
| 12 Mbps | QPSK | ½ | 64 |
| 18 Mbps | QPSK | ¾ | 80 |
| 24 Mbps | 16 QAM | ½ | 80 |
| 36 Mbps | 16 QAM | ¾ | 100 |
| 48 Mbps | 64 QAM | ⅔ | 120 |
| 54 Mbps | 64 QAM | ¾ | 128 |

Alternate embodiments may use fewer or more outputs in the survivor memory subsystem of the of the Viterbi decoder to provide for different decision depths. Furthermore, other embodiments may use different decision depths for the different data rates and coding rates.

Thus, while some embodiments, contexts, and applications have been described herein, the invention is not limited to those embodiments, contexts, and applications.

Note that in the above description, many settable variables, flags, and tables have been described. These provide for flexibility. In one embodiment, these variables are loaded into the registers 137 in the receiver chip via the configuration port SPI. Different embodiments of the invention may have more or fewer such registers and corresponding settable parameters or flags.

While one embodiment of the inventive Viterbi decoder uses a register-exchange architecture for the survivor memory, an alternate embodiment uses another memory structure, for example a RAM implementing a traceback architecture. The programmable decision depth feature of the invention is then implemented slightly differently, and how to modify a memory structure to provide programmable decision depths would be clear to one in the art.

While an embodiment has been described for decoding OFDM packets, the invention may be embodied in receivers and receive signal processors for other types of packets.

While an embodiment for operation with RF frequencies in the 5 GHz range has been described, the invention may be embodied for operating at other RF frequency ranges. Furthermore, while an embodiment for operation conforming to the IEEE 802.11a standard has been described, the invention may be embodied in transceivers conforming to other standards and for other applications that require reducing decoding latency, including, for example, the IEEE 802.1 μg standard that also uses COFDM, another of the 802.11 PHY standards, other WLAN standards, bluetooth, GSM, PHS, and other cellular wireless telephony standards. Applications that can be accommodated by RF transceiver 400 are IEEE 802.11a and 802.11 g COFDM wireless LANs and links, wireless Ethernet, Hiperlan I, Hiperlan II, European Technical Standards Institute (ETSI) broadband radio access network (BRAN), and multimedia mobile access communication (MMAC) systems, wireless local area networks, local multipoint distribution service (LMDS) IF strips, wireless digital video, wireless USB links, wireless IEEE 1394 links, TDMA packet radios, low-cost point-to-point links, voice-over-IP portable "cell phones" (wireless Internet telephones), etc.

Furthermore, while embodiments described herein are for an integrated circuit that includes MOS transistors, the invention is not restricted to MOS transistor circuits. Furthermore, while CMOS embodiments are described herein, the invention is not restricted to a CMOS integrated circuit.

Thus, while there has been described what is believed to be the preferred embodiments of the invention, those skilled in the art will recognize that other and further modifications may be made thereto without departing from the spirit of the invention, and it is intended to claim all such changes and modifications as fall within the scope of the invention.

What is claimed is:

1. An adaptive Viterbi decoder having a coded signal input accepting a coded signal received in a wireless receiver, the receiver to receive packets of information in a wireless data network, each packet having payload data coded at one or more of a set of data rates and modulated according to one of a set of modulation schemes, the packet having a packet structure that includes one or more header symbols containing information on the data rate and modulation scheme of the payload data, the header symbols encoded at a first data rate and using a first modulation scheme, the receiver including:

a buffer preceding the Viterbi decoder having an output coupled to the coded signal input of the Viterbi decoder and of a length long enough to buffer input data while the decoder decodes the one or more header symbols, the decoder comprising:

a branch metric generator with an input to the coded signal and generating branch metrics;

an ACS subsystem coupled to and accepting the branch metrics from the branch metric generator; and a survivor memory subsystem coupled to and accepting input from the ACS subsystem, the survivor memory subsystem having a plurality of outputs, each providing a decoded version of the coded input signal decoded to a distinct decision depth;

the Viterbi decoder being programmable to decode the input signal to one of a plurality of decision depths by selecting one of the memory unit outputs, wherein the Viterbi decoder is initially set to decode at the decision depth suitable for decoding the header, and after the Viterbi decoder decodes the one or more header symbols and the data rate of the remainder of the received packet is determined from the one or more header symbols, the output of the Viterbi decoder is selected to be an output suitable for decoding the input signals at the determined data rate, wherein the survivor memory has two outputs corresponding to a full decision depth suitable for a plurality of data rates and a shortened decision depth suitable for the first data rate, at least one of the plurality of data rates greater than the first data rate, wherein the one or more header symbols are decoded at the shortened decision depth, such that the length of the buffer is less than for decoding at the full decision depth.

2. An adaptive Viterbi decoder having a coded signal input accepting a coded signal received in a wireless receiver, the receiver to receive packets of information in a wireless data network, each packet having payload data coded at one or more of a set of data rates and modulated according to one of a set of modulation schemes, the packet having a packet structure that includes one or more header symbols containing information on the data rate and modulation scheme of the payload data, the header symbols encoded at a first data rate and using a first modulation scheme, the receiver including:

a buffer preceding the Viterbi decoder having an output coupled to the coded signal input of the Viterbi decoder and of a length lone enough to buffer input data while the decoder decodes the one or more header symbols, the decoder comprising:

a branch metric generator with an input to the coded signal and generating branch metrics;

an ACS subsystem coupled to and accepting the branch metrics from the branch metric generator; and a survivor memory subsystem coupled to and accepting input from the ACS subsystem, the survivor memory subsystem having a plurality of outputs, each providing a decoded version of the coded input signal decoded to a distinct decision depth;

the Viterbi decoder being programmable to decode the input signal to one of a plurality of decision depths by selecting one of the memory unit outputs, wherein the survivor memory includes a plurality of registers in a register exchange architecture and wherein each of the survivor memory outputs is a tap to a different one of the registers such that only registers up to a particular tap are used to determine the decoded signal out of the particular tap, the decoder further comprising:

a selector accepting and responsive to a select input and producing a selected signal output, the plurality of register taps coupled to the selector, the selector selecting as the selected signal output one of the register output taps according to the select input.

3. A decoder as recited in claim 2, wherein the Viterbi decoder is initially set to decode at the decision depth suitable for decoding the one or more header symbols and to determine the data rate of the remainder of the received packet, and wherein the select input is coupled to the decoder output and a function of the determined data rate such that the selector selects a register tap suitable for decoding the input signals at the determined data rate.

4. A decoder as recited in claim 2, wherein the survivor memory includes 128 registers to provide Viterbi decoding with a decision depth of up to 128 levels.

5. A decoder as recited in claim 2, wherein the ACS subsystem includes a plurality of ACS units.

6. An adaptive Viterbi decoder having a coded signal input accepting a coded signal received in a wireless receiver, the receiver to receive packets of information in a wireless data network, each packet having payload data coded at one or more of a set of data rates and modulated according to one of a set of modulation schemes, the packet having a packet structure that includes one or more header symbols containing information on the data rate and modulation scheme of the payload data, the header symbols encoded at a first data rate and using a first modulation scheme, the receiver including:

a buffer preceding the Viterbi decoder having an output coupled to the coded signal input of the Viterbi decoder and of a length long enough to buffer input data while the decoder decodes the one or more header symbols, the decoder comprising:

a branch metric generator with an input to the coded signal and generating branch metrics;

an ACS subsystem coupled to and accepting the branch metrics from the branch metric generator; and a survivor memory subsystem coupled to and accepting input from the ACS subsystem, the survivor memory subsystem having a plurality of outputs, each providing a decoded version of the coded input signal decoded to a distinct decision depth;

the Viterbi decoder being programmable to decode the input signal to one of a plurality of decision depths by selecting one of the memory unit outputs, wherein the survivor memory includes a plurality of registers in a register exchange architecture and wherein each of the survivor memory outputs is a tap to one of the registers such that only registers up to a particular tap are used to determine the decoded signal out of the particular tap, the decoder further comprising:

a selector accepting and responsive to a select input and producing a selected signal output, the plurality of register taps coupled to the selector, the selector selecting as the selected signal output one of the register output taps according to the select input; and a switch accepting a clock signal and the select input, and having a set of clock outputs to the registers, the switch to selectively turn off the clock to those registers not being used to determine the decoded signal.

7. A wireless receiver for receiving packets of a wireless data network, each packet having payload data coded at one or more of a set of data rates and modulated according to one of a set of modulation schemes, the packet having a packet structure that includes one or more header symbols containing information on the data rate and modulation scheme of the payload data, the header symbols encoded at a first data rate and using a first modulation scheme, the receiver comprising:

an adaptive Viterbi decoder to decode a coded signal, the decoder including:

a branch metric generator with an input to the coded signal and generating branch metrics;

an ACS subsystem coupled to and accepting the branch metrics from the branch metric generator;

a survivor memory subsystem coupled to and accepting input from the ACS subsystem, the survivor memory subsystem having a plurality of outputs, each providing a decoded version of the coded input signal decoded to a distinct decision depth such that the Viterbi decoder is programmable to decode the input signal to one of a plurality of decision depths; and a buffer preceding the Viterbi decoder and having an output coupled to the coded signal input of the Viterbi decoder, the buffer having a length long enough to buffer input data while the decoder decodes the one or more header symbols, wherein the Viterbi decoder is initially set to decode at the decision depth suitable for decoding the header, and after the Viterbi decoder decodes the one or more header symbols and the data rate of the remainder of the received packet is determined from the one or more header symbols, the output of the Viterbi decoder is selected to be a survivor memory output suitable for decoding the input signals at the determined data rate, and wherein the survivor memory has at least two outputs corresponding to a shortened decision depth suitable for the first data rate, and a full decision depth and none or more intermediate decision depths, the intermediate and full decision depths suitable for a plurality of data rates, at least one of the plurality of data rates greater than the first data rate, wherein the one or more header symbols are decoded at the shortened decision depth, such that the length of the buffer is less than for decoding at the full decision depth.

8. A receiver as recited in claim 7, the receiver for receiving signals in a wireless local area network.

9. A decoder as recited in claim 8, wherein the wireless data network conforms to an IEEE 802.11 standard that uses COFDM.

10. A receiver as recited in claim 7, wherein the full data depth is 128 levels.

* * * * *

UNITED STATES PATENT AND TRADEMARK OFFICE
CERTIFICATE OF CORRECTION

PATENT NO. : 7,046,746 B1 Page 1 of 1
APPLICATION NO. : 10/095758
DATED : May 16, 2006
INVENTOR(S) : Keaney et al.

It is certified that error appears in the above-identified patent and that said Letters Patent is hereby corrected as shown below:

In column 9, line 44, kindly change "($corr_{13}boundary$)" to --($corr\_boundary$)--.

In column 15, line 38, kindly change "length lone enough" to --length long enough--.

Signed and Sealed this

First Day of August, 2006

JON W. DUDAS
*Director of the United States Patent and Trademark Office*